US012701693B2

(12) United States Patent
　Fujii et al.

(10) Patent No.: US 12,701,693 B2
(45) Date of Patent: Aug. 4, 2026

(54) OXIDE SEMICONDUCTOR DEVICE AND OXIDE SEMICONDUCTOR MEMORY DEVICE

(71) Applicant: Kioxia Corporation, Tokyo (JP)

(72) Inventors: Shosuke Fujii, Kuwana Mie (JP);
　　　　　　Kotaro Noda, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 444 days.

(21) Appl. No.: 18/338,837

(22) Filed: Jun. 21, 2023

(65) Prior Publication Data

US 2023/0422482 A1　Dec. 28, 2023

(30) Foreign Application Priority Data

Jun. 22, 2022　(JP) ................................. 2022-100703

(51) Int. Cl.
　*H10B 12/00*　(2023.01)
(52) U.S. Cl.
　CPC ............. *H10B 12/33* (2023.02); *H10B 12/05* (2023.02)
(58) Field of Classification Search
　CPC . H10D 30/6728; H10D 30/6755; H10D 62/10
　See application file for complete search history.

(56) References Cited

U.S. PATENT DOCUMENTS

| | | | |
|---|---|---|---|
| 11,139,396 B2 | 10/2021 | Karda et al. | |
| 2010/0059744 A1* | 3/2010 | Yin | H10D 30/6755 |
| | | | 257/E29.291 |

| | | | |
|---|---|---|---|
| 2020/0303554 A1* | 9/2020 | Sawabe | H10D 30/6728 |
| 2020/0381557 A1* | 12/2020 | Hattori | H10D 30/6755 |
| 2020/0388685 A1 | 12/2020 | Sharma et al. | |
| 2021/0066296 A1* | 3/2021 | Kutsukake | H10D 84/859 |

(Continued)

FOREIGN PATENT DOCUMENTS

| | | |
|---|---|---|
| JP | 2005-175386 A | 6/2005 |
| JP | 2007-142288 A | 6/2007 |

(Continued)

OTHER PUBLICATIONS

Kyung Kyu Min et al., "Vertical Inner Gate Transistors for 4F2 DRAM Cell", IEEE Transactions on Electron Devices, Mar. 2020, pp. 944-948, vol. 67, No. 3 (5 pages).

*Primary Examiner* — William B Partridge
*Assistant Examiner* — Felix B Andrews
(74) *Attorney, Agent, or Firm* — Foley & Lardner LLP

(57) ABSTRACT

A semiconductor device according to an embodiment includes: a first electrode; a second electrode; a gate electrode between the first electrode and the second electrode; a first insulating layer; a second insulating layer; a gate insulating layer surrounding the gate electrode; an oxide semiconductor layer surrounding the gate insulating layer, the oxide semiconductor layer including a first region between the gate insulating layer and the first electrode, a second region between the gate insulating layer and the second electrode, a third region between the gate insulating layer and the first insulating layer, and a fourth region between the gate insulating layer and the second insulating layer. A first thickness of the first region and a second thickness of the second region are equal to or less than at least one of a third thickness of the third region or a fourth thickness of the fourth region.

10 Claims, 18 Drawing Sheets

(56)        References Cited

U.S. PATENT DOCUMENTS

2022/0102494 A1*   3/2022   Chen ................. H10D 30/6735
2022/0310612 A1     9/2022   Okajima
2023/0238460 A1*   7/2023   Kim .................... H10D 64/689
                                                          257/288

FOREIGN PATENT DOCUMENTS

JP           2009252887  A  * 10/2009
JP           2022-147872  A     10/2022
KR            102414038  B1 *  6/2022   ............. H04N 25/79

* cited by examiner

FIG.13

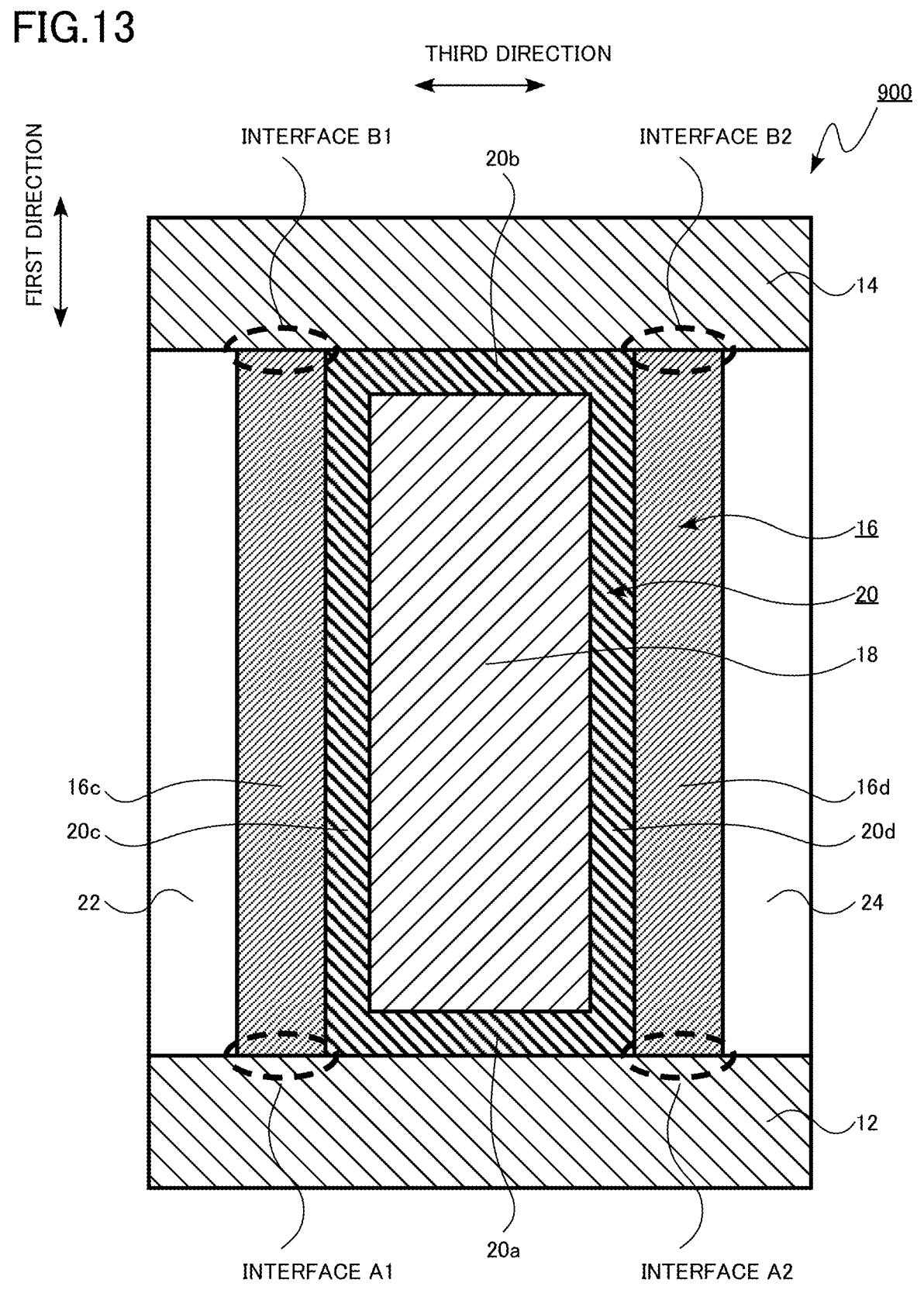

THIRD DIRECTION

FIRST DIRECTION

900

INTERFACE B1

20b

INTERFACE B2

14

16

20

18

16c

20c

22

16d

20d

24

INTERFACE A1

20a

INTERFACE A2

THIRD DIRECTION

FIRST DIRECTION

101

16b

20b

14 t2 t6

20x
20y
20
16

20

18

16c
20c 16d
20d

22

24 t5 t1

12

16a

20a t3　t7 t8　t4

OXIDE SEMICONDUCTOR DEVICE AND OXIDE SEMICONDUCTOR MEMORY DEVICE

CROSS-REFERENCE TO RELATED APPLICATION

This application is based upon and claims the benefit of priority from Japanese Patent Application No. 2022-100703, filed on Jun. 22, 2022, the entire contents of which are incorporated herein by reference.

FIELD

Embodiments described herein relate generally to a semiconductor device and a semiconductor memory device.

BACKGROUND

An oxide semiconductor transistor that forms a channel in an oxide semiconductor layer has excellent characteristics that a channel leakage current at the time of OFF operation is extremely small. Therefore, for example, the oxide semiconductor transistor can be applied to a switching transistor of a memory cell of a dynamic random access memory (DRAM).

BRIEF DESCRIPTION OF THE DRAWINGS

FIG. 13 is a schematic sectional view of a semiconductor device of a comparative example;

FIG. 14 is an explanatory view of functions and effects of the semiconductor device according to the first embodiment;

FIG. 15 is a schematic sectional view of a semiconductor device of a first modification of the first embodiment;

DETAILED DESCRIPTION

Figure 1:
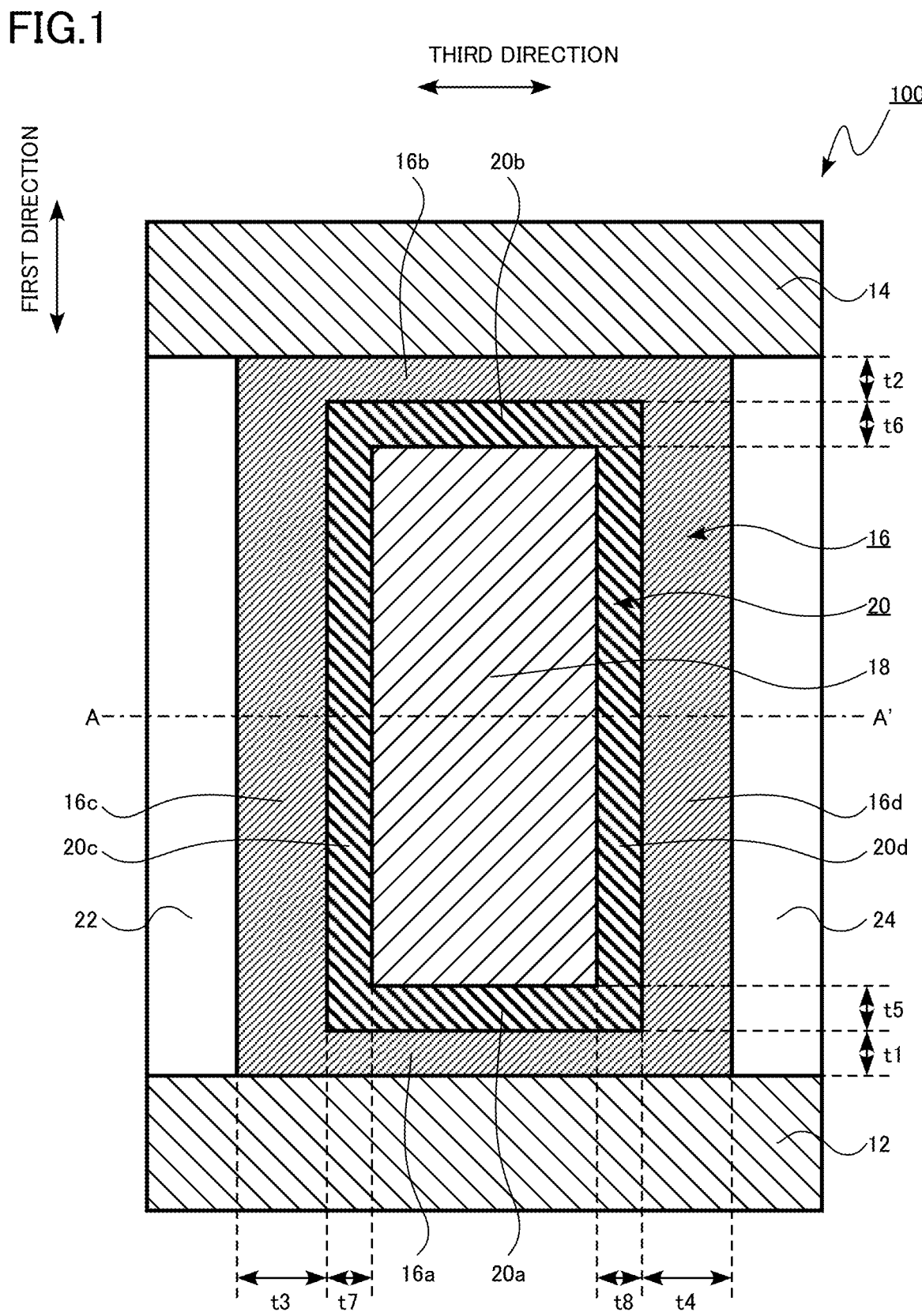
FIG. 1 is a schematic sectional view of a semiconductor device according to a first embodiment.

A semiconductor device according to an embodiment includes: a first electrode; a second electrode; a gate electrode provided between the first electrode and the second electrode and extending in a second direction intersecting a first direction connecting the first electrode and the second electrode; a first insulating layer provided in a third direction intersecting the first direction and the second direction with respect to the gate electrode; a second insulating layer provided in the third direction with respect to the gate electrode, the gate electrode being provided between the second insulating layer and the first insulating layer; a gate insulating layer surrounding the gate electrode, the gate insulating layer including a first portion provided between the gate electrode and the first electrode, a second portion provided between the gate electrode and the second electrode, a third portion provided between the gate electrode and the first insulating layer, and a fourth portion provided between the gate electrode and the second insulating layer; and an oxide semiconductor layer surrounding the gate insulating layer, the oxide semiconductor layer including a first region between the first portion and the first electrode, a second region between the second portion and the second electrode; a third region between the third portion and the first insulating layer, and a fourth region between the fourth portion and the second insulating layer. A first thickness of the first region and a second thickness of the second region are equal to or less than at least one of a third thickness of the third region and a fourth thickness of the fourth region.

Hereinafter, embodiments of the present disclosure will be described with reference to the drawings. In the following description, the same or similar members and the like are denoted by the same reference numerals, and the description of the members and the like that have been described once may be appropriately omitted.

In the present specification, the terms "upper", "lower", "upper portion", or "lower portion" may be used for convenience. The terms "upper", "lower", "upper portion", and "lower portion" are merely terms indicating a relative positional relationship in the drawings, and are not terms that define a positional relationship with respect to gravity.

Qualitative analysis and quantitative analysis of chemical compositions of members constituting the semiconductor device and the semiconductor memory device in the present specification can be performed by, for example, Secondary Ion Mass Spectrometry (SIMS), Energy Dispersive X-Ray Spectroscopy (EDX), or Rutherford Back-Scattering Spectroscopy (RBS). In addition, for example, Transmission Electron Microscope (TEM) can be used for measuring the thickness of the members constituting the semiconductor device and the semiconductor memory device, the distance between the members, the crystal grain size, and the like.

First Embodiment

A semiconductor device according to a first embodiment includes: a first electrode; a second electrode; a gate electrode provided between the first electrode and the second electrode and extending in a second direction intersecting a first direction connecting the first electrode and the second electrode; a first insulating layer provided in a third direction intersecting the first direction and the second direction with respect to the gate electrode; a second insulating layer provided in the third direction with respect to the gate electrode, the gate electrode being provided between the second insulating layer and the first insulating layer; a gate insulating layer surrounding the gate electrode, the gate insulating layer including a first portion provided between the gate electrode and the first electrode, a second portion provided between the gate electrode and the second electrode, a third portion provided between the gate electrode and the first insulating layer, and a fourth portion provided between the gate electrode and the second insulating layer; and an oxide semiconductor layer surrounding the gate insulating layer, the oxide semiconductor layer including a first region between the first portion and the first electrode, a second region between the second portion and the second electrode; a third region between the third portion and the first insulating layer, and a fourth region between the fourth portion and the second insulating layer. A first thickness of the first region and a second thickness of the second region are equal to or less than at least one of a third thickness of the third region and a fourth thickness of the fourth region.

Figure 2:
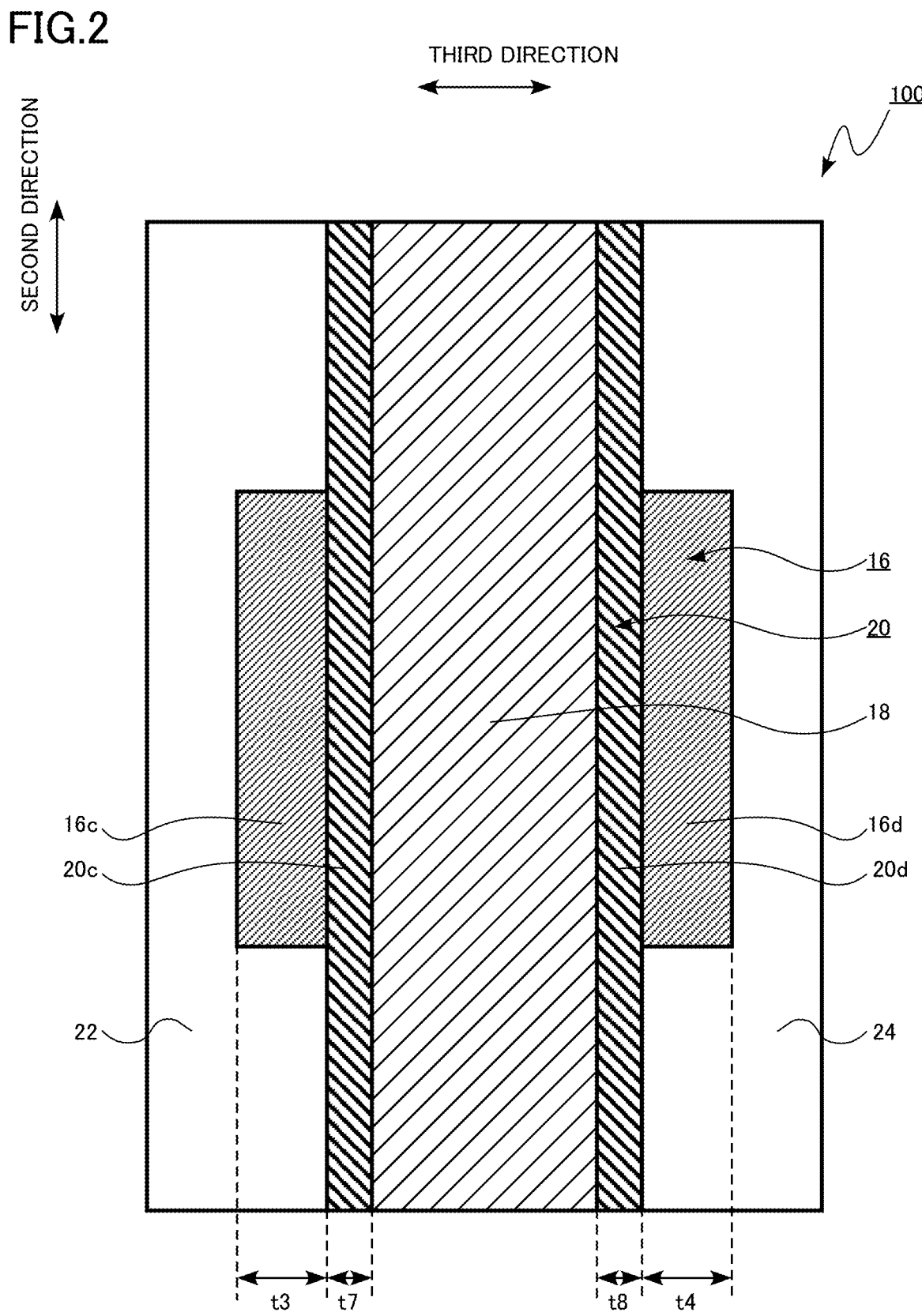
FIG. 2 is a schematic sectional view of the semiconductor device according to the first embodiment.

FIGS. 1 and 2 are schematic sectional views of the semiconductor device according to the first embodiment. FIG. 2 is a cross-sectional view taken along line AA' of FIG. 1.

The semiconductor device according to the first embodiment is a transistor 100. The transistor 100 is an oxide semiconductor transistor in which a channel is formed in an oxide semiconductor. In the transistor 100, an oxide semiconductor layer in which a channel is formed is provided surrounding the gate electrode. The transistor 100 is a so-called vertical transistor.

The transistor 100 includes a lower electrode 12, an upper electrode 14, an oxide semiconductor layer 16, a gate electrode 18, a gate insulating layer 20, a first insulating layer 22, and a second insulating layer 24. The oxide semiconductor layer 16 includes a first region 16a, a second region 16b, a third region 16c, and a fourth region 16d. The gate insulating layer 20 includes a first portion a second portion 20b, a third portion 20c, and a fourth portion 20d.

The lower electrode 12 is an example of the first electrode. The upper electrode 14 is an example of the second electrode.

A direction from the lower electrode 12 toward the upper electrode 14 is the first direction. The second direction intersects the first direction. The third direction intersects the first direction and the second direction.

For example, the second direction is perpendicular to the first direction. Further, for example, the third direction is perpendicular to the first direction and the second direction.

In FIG. 1, the vertical direction is the first direction. In FIG. 1, the left-right direction is the third direction. In FIG. 2, the vertical direction is the second direction. In FIG. 2, the left-right direction is the third direction.

The lower electrode 12 is provided below the oxide semiconductor layer 16 and the gate electrode 18. The lower electrode 12 is electrically connected to the oxide semiconductor layer 16. The lower electrode 12 is in contact with, for example, the oxide semiconductor layer 16. The lower electrode 12 functions as a source electrode or a drain electrode of the transistor 100.

The lower electrode 12 is a conductor. The lower electrode 12 includes, for example, an oxide conductor. The lower electrode 12 contains, for example, indium (In), tin (Sn), and oxygen (O). The lower electrode 12 contains, for example, indium tin oxide. The lower electrode 12 is, for example, an indium tin oxide layer.

The lower electrode 12 contains, for example, metal. The lower electrode 12 contains, for example, tungsten (W), molybdenum (Mo), copper (Cu), aluminum (Al), titanium (Ti), or tantalum (Ta). The lower electrode 12 contains, for example, tungsten nitride, titanium nitride, tantalum nitride, or tantalum carbide. The lower electrode 12 is, for example, a tungsten layer, a molybdenum layer, a copper layer, an aluminum layer, a titanium layer, a tantalum layer, a tungsten nitride layer, a titanium nitride layer, a tantalum nitride layer, or a tantalum carbide layer.

The lower electrode 12 may have, for example, a stacked structure of a plurality of conductors. The lower electrode 12 has, for example, a stacked structure of an oxide conductor layer and a metal layer. For example, the surface of the lower electrode 12 on the oxide semiconductor layer 16 side is an oxide conductor layer.

The upper electrode 14 is provided on the oxide semiconductor layer 16 and the gate electrode 18. The upper electrode 14 is electrically connected to the oxide semiconductor layer 16. The upper electrode 14 is in contact with, for example, the oxide semiconductor layer 16. The upper electrode 14 functions as a source electrode or a drain electrode of the transistor 100.

The upper electrode 14 is a conductor. The upper electrode 14 includes, for example, an oxide conductor. The upper electrode 14 contains, for example, indium (In), tin (Sn), and oxygen (O). The upper electrode 14 contains, for example, indium tin oxide. The upper electrode 14 is, for example, an indium tin oxide layer.

The upper electrode 14 contains, for example, metal. The upper electrode 14 contains, for example, tungsten (W), molybdenum (Mo), copper (Cu), aluminum (Al), titanium (Ti), or tantalum (Ta). The upper electrode 14 contains, for example, tungsten nitride, titanium nitride, tantalum nitride, or tantalum carbide. The upper electrode 14 is, for example, a tungsten layer, a molybdenum layer, a copper layer, an aluminum layer, a titanium layer, a tantalum layer, a tungsten nitride layer, a titanium nitride layer, a tantalum nitride layer, or a tantalum carbide layer.

The upper electrode 14 may have, for example, a stacked structure of a plurality of conductors. The upper electrode 14 has, for example, a stacked structure of an oxide conductor layer and a metal layer. For example, the surface of the upper electrode 14 on the oxide semiconductor layer 16 side is an oxide conductor layer.

The lower electrode 12 and the upper electrode 14 are formed of, for example, the same material. The lower electrode 12 and the upper electrode 14 are, for example, oxide conductors containing indium (In), tin (Sn), and oxygen (O). The lower electrode 12 and the upper electrode 14 contain, for example, indium tin oxide. The lower electrode 12 and the upper electrode 14 are, for example, indium tin oxide layers.

The gate electrode 18 is provided between the lower electrode 12 and the upper electrode 14. The gate electrode 18 extends in the second direction. As shown in FIG. 1, the gate electrode 18 is surrounded by the oxide semiconductor layer 16 in a cross section parallel to the first direction and the third direction.

The gate electrode 18 is a conductor. The gate electrode 18 is, for example, a metal, a metal compound, or a semiconductor. The gate electrode 18 contains, for example, tungsten (W). The gate electrode 18 is, for example, a tungsten layer.

The length of the gate electrode 18 in the first direction is, for example, 20 nm or more and 100 nm or less.

The first insulating layer 22 is provided in the third direction with respect to the gate electrode 18. The first insulating layer 22 is provided, for example, between the lower electrode 12 and the upper electrode 14. The first insulating layer 22 is in contact with, for example, the oxide semiconductor layer 16.

The first insulating layer 22 is an insulator. The first insulating layer 22 is, for example, oxide, oxynitride, or nitride. The first insulating layer 22 contains, for example, silicon (Si) and oxygen (O). The first insulating layer 22 includes, for example, silicon oxide. The first insulating layer 22 is, for example, a silicon oxide layer.

The second insulating layer 24 is provided in the third direction with respect to the gate electrode 18. The gate electrode 18 is provided between the first insulating layer 22 and the second insulating layer 24. The second insulating layer 24 is provided, for example, between the lower electrode 12 and the upper electrode 14. The second insulating layer 24 is in contact with, for example, the oxide semiconductor layer 16.

The second insulating layer 24 is an insulator. The second insulating layer 24 is, for example, oxide, oxynitride, or nitride. The second insulating layer 24 contains, for example, silicon (Si) and oxygen (O). The second insulating layer 24 includes, for example, silicon oxide. The second insulating layer 24 is, for example, a silicon oxide layer.

The gate insulating layer 20 is provided between the lower electrode 12 and the upper electrode 14. As shown in FIG. 1, the gate insulating layer 20 surrounds the gate electrode 18 in a cross section parallel to the first direction and the third direction. The gate insulating layer 20 is provided between the oxide semiconductor layer 16 and the gate electrode 18.

The gate insulating layer 20 is separated from the lower electrode 12. The gate insulating layer 20 is separated from the upper electrode 14.

The gate insulating layer 20 includes the first portion 20a, the second portion 20b, the third portion 20c, and the fourth portion 20d. The first portion 20a is provided between the gate electrode 18 and the lower electrode 12. The second portion 20b is provided between the gate electrode 18 and the upper electrode 14. The third portion 20c is provided between the gate electrode 18 and the first insulating layer 22. The fourth portion 20d is provided between the gate electrode 18 and the second insulating layer 24.

The gate insulating layer 20 is, for example, oxide, oxynitride, or nitride. The gate insulating layer contains, for example, silicon oxide, aluminum oxide, hafnium oxide, silicon nitride, aluminum nitride, hafnium nitride, silicon oxynitride, or hafnium oxynitride. The gate insulating layer 20 is, for example, a silicon oxide layer, an aluminum oxide layer, a hafnium oxide layer, a silicon nitride layer, an aluminum nitride layer, a hafnium nitride layer, a silicon oxynitride layer, or a hafnium oxynitride layer. The gate insulating layer 20 may have, for example, a stacked structure of two or more kinds of films.

The thickness of the gate insulating layer 20 is, for example, 2 nm or more and 10 nm or less.

A fifth thickness (t5 in FIG. 1) of the first portion 20a, a sixth thickness (t6 in FIG. 1) of the second portion 20b, a seventh thickness (t7 in FIG. 1) of the third portion 20c, and an eighth thickness (t8 in FIG. 1) of the fourth portion 20d are, for example, equal.

For example, the fifth thickness t5 of the first portion 20a is different from the sixth thickness t6 of the second portion 20b.

The oxide semiconductor layer 16 is provided between the lower electrode 12 and the upper electrode 14. The oxide semiconductor layer 16 is in contact with, for example, the lower electrode 12. The oxide semiconductor layer 16 is in contact with, for example, the upper electrode 14.

As shown in FIG. 1, the oxide semiconductor layer 16 surrounds the gate electrode 18 and the gate insulating layer 20 in a cross section parallel to the first direction and the third direction.

In the oxide semiconductor layer 16, a channel serving as a current path is formed when the transistor 100 is turned on.

The oxide semiconductor layer 16 includes the first region 16a, the second region 16b, the third region 16c, and the fourth region 16d. The first region 16a is provided between the first portion 20a of the gate insulating layer 20 and the lower electrode 12. The second region 16b is provided between the second portion 20b of the gate insulating layer 20 and the upper electrode 14. The third region 16c is provided between the third portion of the gate insulating layer 20 and the first insulating layer 22. The fourth region 16d is provided between the fourth portion 20d of the gate insulating layer and the second insulating layer 24.

The oxide semiconductor layer 16 is an oxide semiconductor. The oxide semiconductor layer 16 is amorphous, for example.

The oxide semiconductor layer 16 contains, for example, at least one element selected from the group consisting of indium (In), gallium (Ga), silicon (Si), aluminum (Al), tin (Sn), and zinc (Zn), and oxygen (O). The oxide semiconductor layer 16 contains, for example, at least one element selected from the group consisting of indium (In), gallium (Ga), silicon (Si), aluminum (Al), and tin (Sn), zinc (Zn), and oxygen (O). The oxide semiconductor layer 16 contains, for example, indium (In), gallium (Ga), zinc (Zn), and oxygen (O). The oxide semiconductor layer 16 contains, for example, indium gallium zinc oxide. The oxide semiconductor layer 16 is, for example, an indium gallium zinc oxide layer.

The oxide semiconductor layer 16 has, for example, a chemical composition different from the chemical composition of the lower electrode 12 and the chemical composition of the upper electrode 14.

The oxide semiconductor layer 16 includes, for example, oxygen vacancies. The oxygen vacancies in the oxide semiconductor layer 16 function as donors.

The first thickness (t1 in FIG. 1) of the first region 16a and the second thickness (t2 in FIG. 1) of the second region 16b are equal to or less than at least one of the third thickness (t3 in FIG. 1) of the third region 16c and the fourth thickness (t4 in FIG. 1) of the fourth region 16d.

For example, the first thickness t1 of the first region 16a and the second thickness t2 of the second region 16b are smaller than at least one of the third thickness t3 of the third region 16c and the fourth thickness t4 of the fourth region 16d.

For example, the first thickness t1 of the first region 16a and the second thickness t2 of the second region 16b are equal to or less than 80% of at least one of the third thickness t3 of the third region 16c and the fourth thickness t4 of the fourth region 16d.

For example, the first thickness t1 of the first region 16*a* and the second thickness t2 of the second region 16*b* are smaller than the third thickness t3 of the third region 16*c* and the fourth thickness t4 of the fourth region 16*d*.

For example, the first thickness t1 of the first region 16*a* and the second thickness t2 of the second region 16*b* are equal to or less than 80% of the third thickness t3 of the third region 16*c* and the fourth thickness t4 of the fourth region 16*d*.

The first thickness t1 of the first region 16*a* and the second thickness t2 of the second region 16*b* are, for example, 1 nm or more and 10 nm or less. The third thickness t3 of the third region 16*c* and the fourth thickness t4 of the fourth region 16*d* are, for example, 5 nm or more and 15 nm or less.

Next, an example of a method of manufacturing the semiconductor device according to the first embodiment will be described.

FIGS. 3, 4, 5, 6, 7, 8, 9, 10, 11, and 12 are schematic sectional views showing an example of the method of manufacturing the semiconductor device according to the first embodiment. FIGS. 3 to 12 each show a cross section corresponding to FIG. 1. FIGS. 3 to 12 are views showing an example of a method of manufacturing the transistor 100.

Hereinafter, a case where the lower electrode 12 is an indium tin oxide layer, the upper electrode 14 is an indium tin oxide layer, the oxide semiconductor layer 16 is an indium gallium zinc oxide layer, the gate electrode 18 is a tungsten layer, the gate insulating layer 20 is a silicon nitride layer, the first insulating layer 22 is a silicon oxide layer, and the second insulating layer 24 is a silicon oxide layer will be described as an example.

First, a first indium tin oxide film 31 and a first silicon oxide film 32 are formed on a substrate (not shown). The first indium tin oxide film 31 and the first silicon oxide film 32 are formed by, for example, a chemical vapor deposition method (CVD method).

The first indium tin oxide film 31 finally becomes the lower electrode 12. In addition, a part of the first silicon oxide film 32 finally becomes a part of the first insulating layer 22 and a part of the second insulating layer 24.

Figure 3:
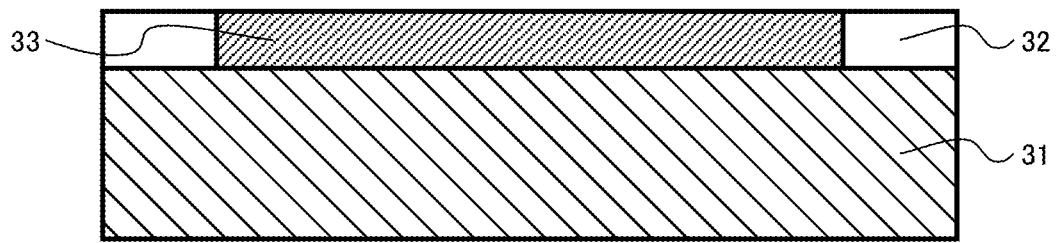
FIG. 3 is a schematic sectional view showing an example of a method of manufacturing the semiconductor device according to the first embodiment.

Next, a first indium gallium zinc oxide film 33 is embedded in the opening provided in the first silicon oxide film 32 (FIG. 3). The opening is formed using, for example, a lithography method and a reactive ion etching method (RIE method). In addition, the first indium gallium zinc oxide film 33 is formed by, for example, a CVD method. Thereafter, the first indium gallium zinc oxide film 33 on the upper surface of the first silicon oxide film 32 is removed by, for example, a chemical mechanical polishing method (CMP method).

The first indium gallium zinc oxide film 33 finally becomes a part of the oxide semiconductor layer 16.

Figure 4:
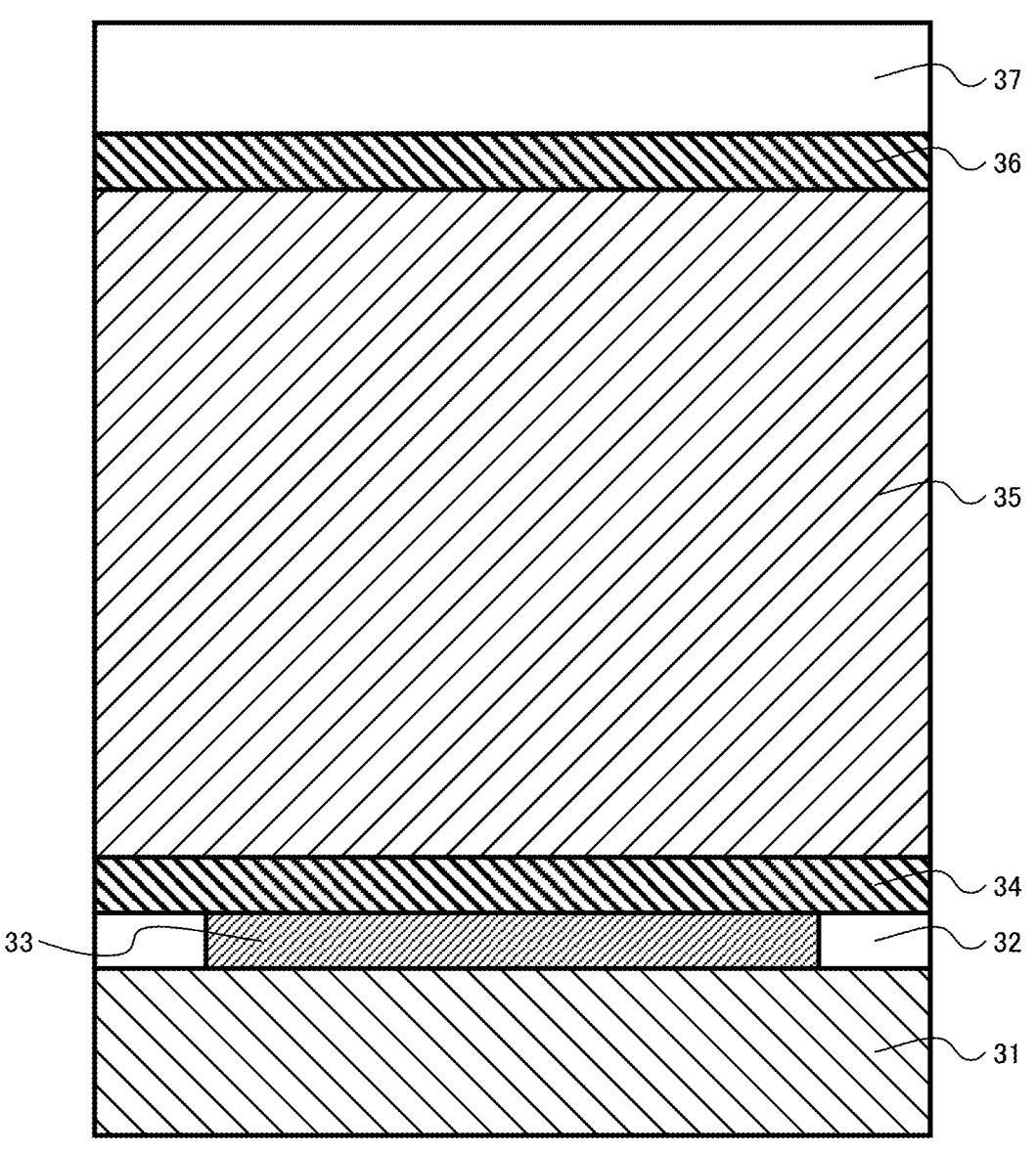
FIG. 4 is a schematic sectional view showing the example of the method of manufacturing the semiconductor device according to the first embodiment.

Next, a first silicon nitride film 34, a tungsten film 35, a second silicon nitride film 36, and a second silicon oxide film 37 are formed in this order on the first silicon oxide film 32 and the first indium gallium zinc oxide film 33 (FIG. 4). The first silicon nitride film 34, the tungsten film 35, the second silicon nitride film 36, and the second silicon oxide film 37 are formed by, for example, a CVD method.

A part of the first silicon nitride film 34 finally becomes a part of the gate insulating layer 20. A part of the tungsten film 35 finally becomes the gate electrode 18. A part of the second silicon nitride film 36 finally becomes a part of the gate insulating layer 20.

Figure 5:
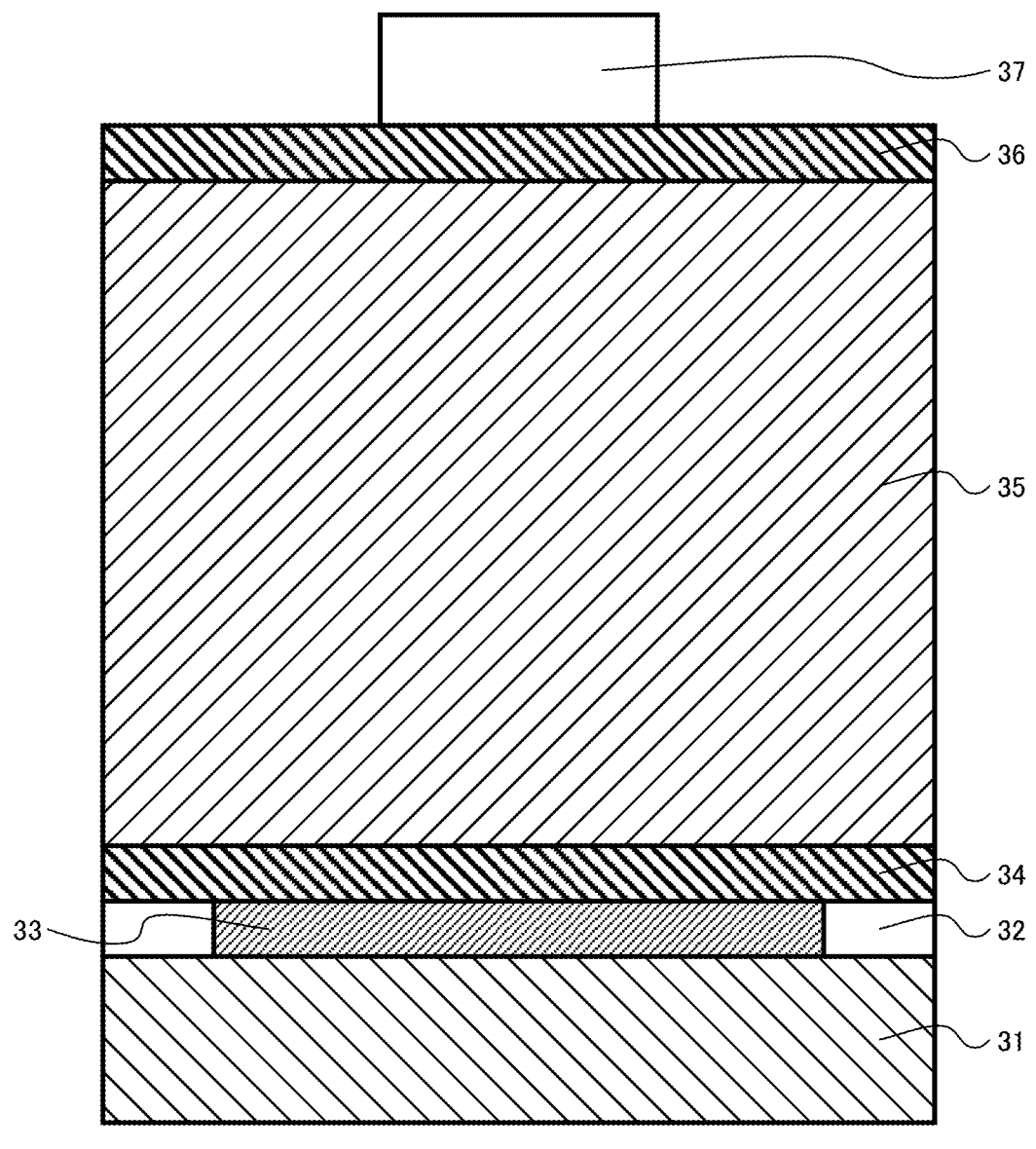
FIG. 5 is a schematic sectional view showing the example of the method of manufacturing the semiconductor device according to the first embodiment.

Next, the second silicon oxide film 37 is patterned (FIG. 5). The patterning of the second silicon oxide film 37 is performed using, for example, a lithography method and an RIE method.

Figure 6:
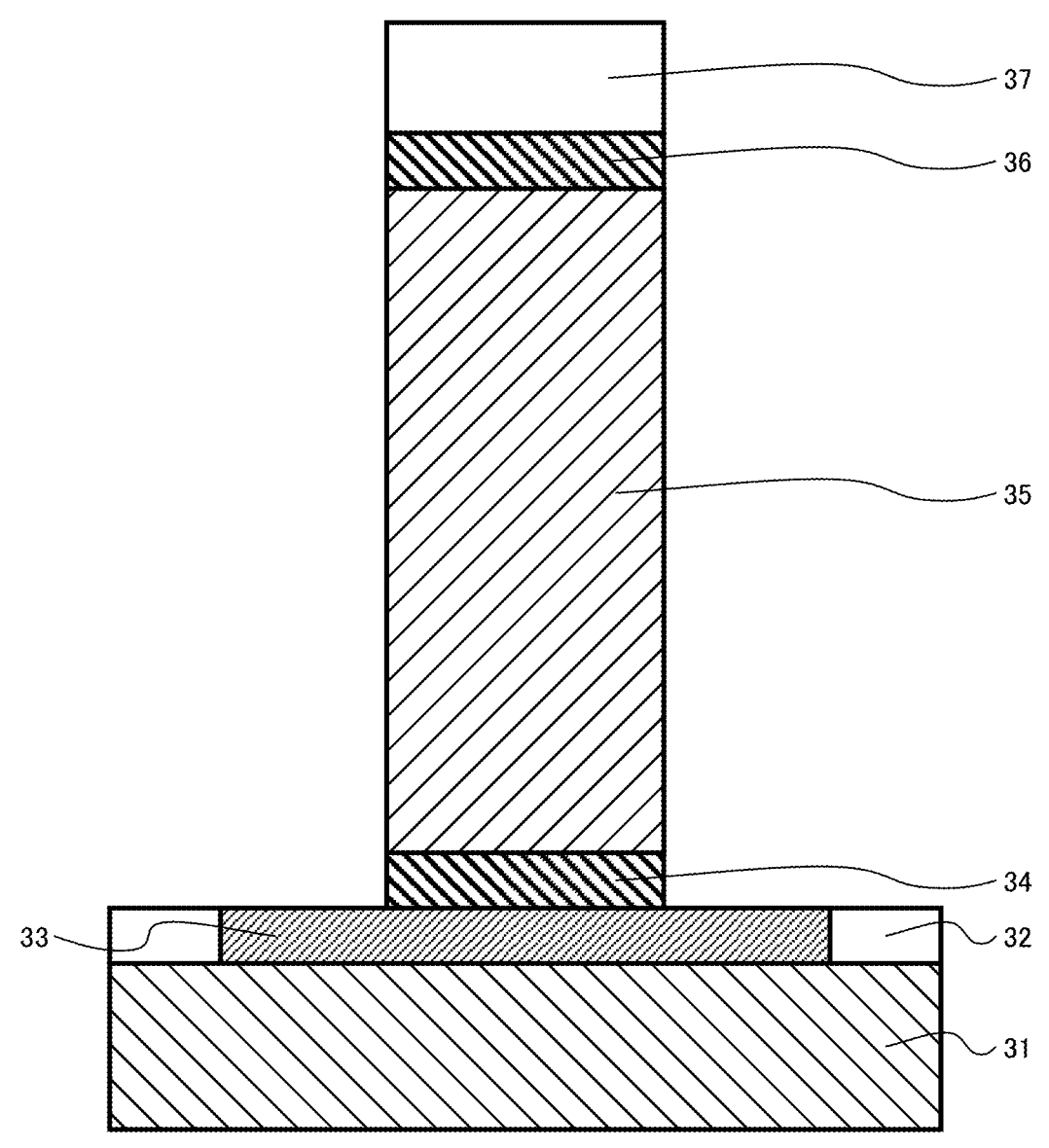
FIG. 6 is a schematic sectional view showing the example of the method of manufacturing the semiconductor device according to the first embodiment.

Next, the second silicon nitride film 36, the tungsten film 35, and the first silicon nitride film 34 are etched using the patterned second silicon oxide film 37 as a mask (FIG. 6). The etching of the second silicon nitride film 36, the tungsten film 35, and the first silicon nitride film 34 is performed using, for example, an RIE method.

Figure 7:
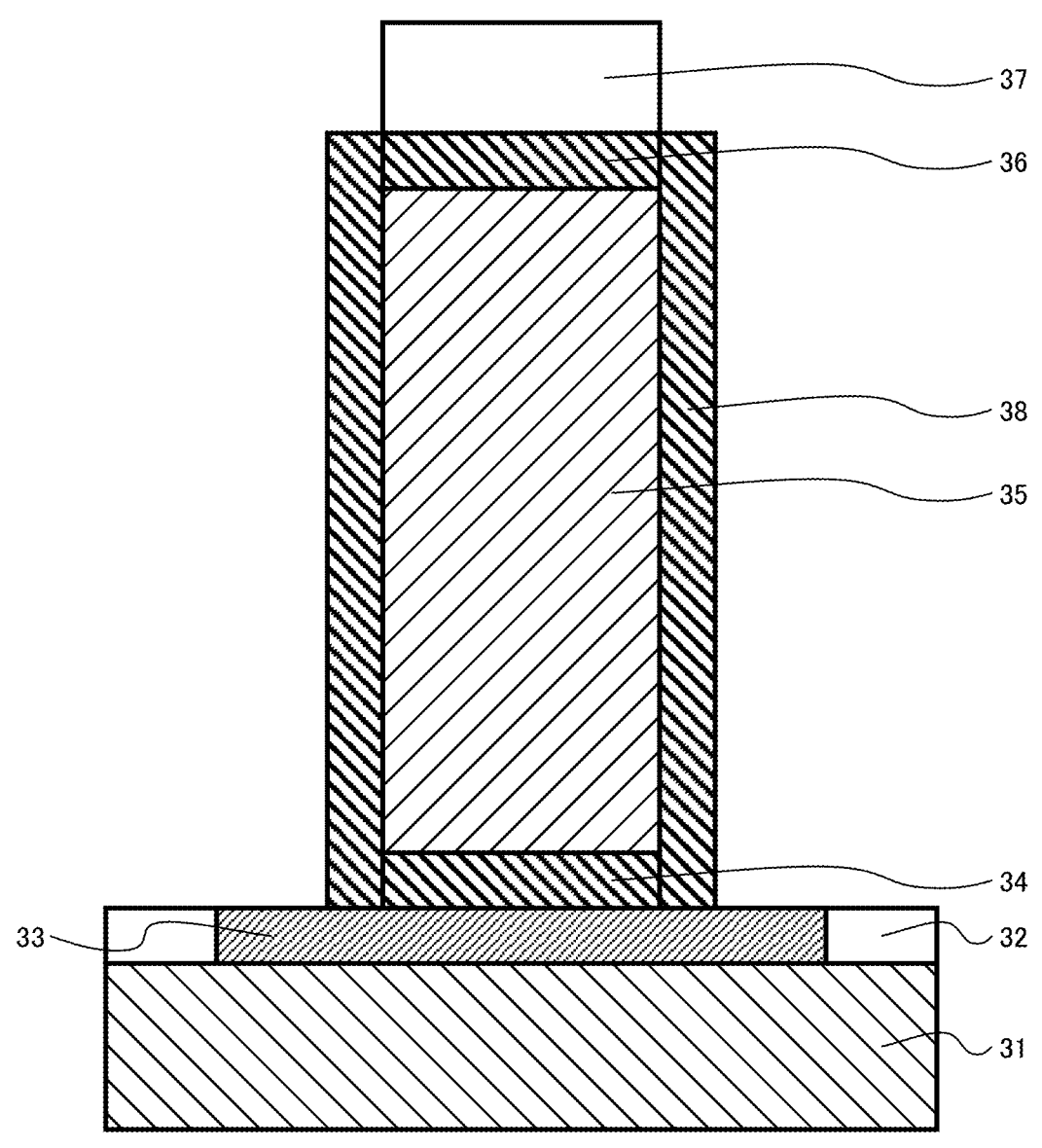
FIG. 7 is a schematic sectional view showing the example of the method of manufacturing the semiconductor device according to the first embodiment.

Next, a third silicon nitride film 38 is formed on the side surface of the tungsten film 35 (FIG. 7). The third silicon nitride film 38 is formed by, for example, deposition of a film by a CVD method and entire surface etch-back using an RIE method. The third silicon nitride film 38 finally becomes a part of the gate insulating layer 20.

Figure 8:
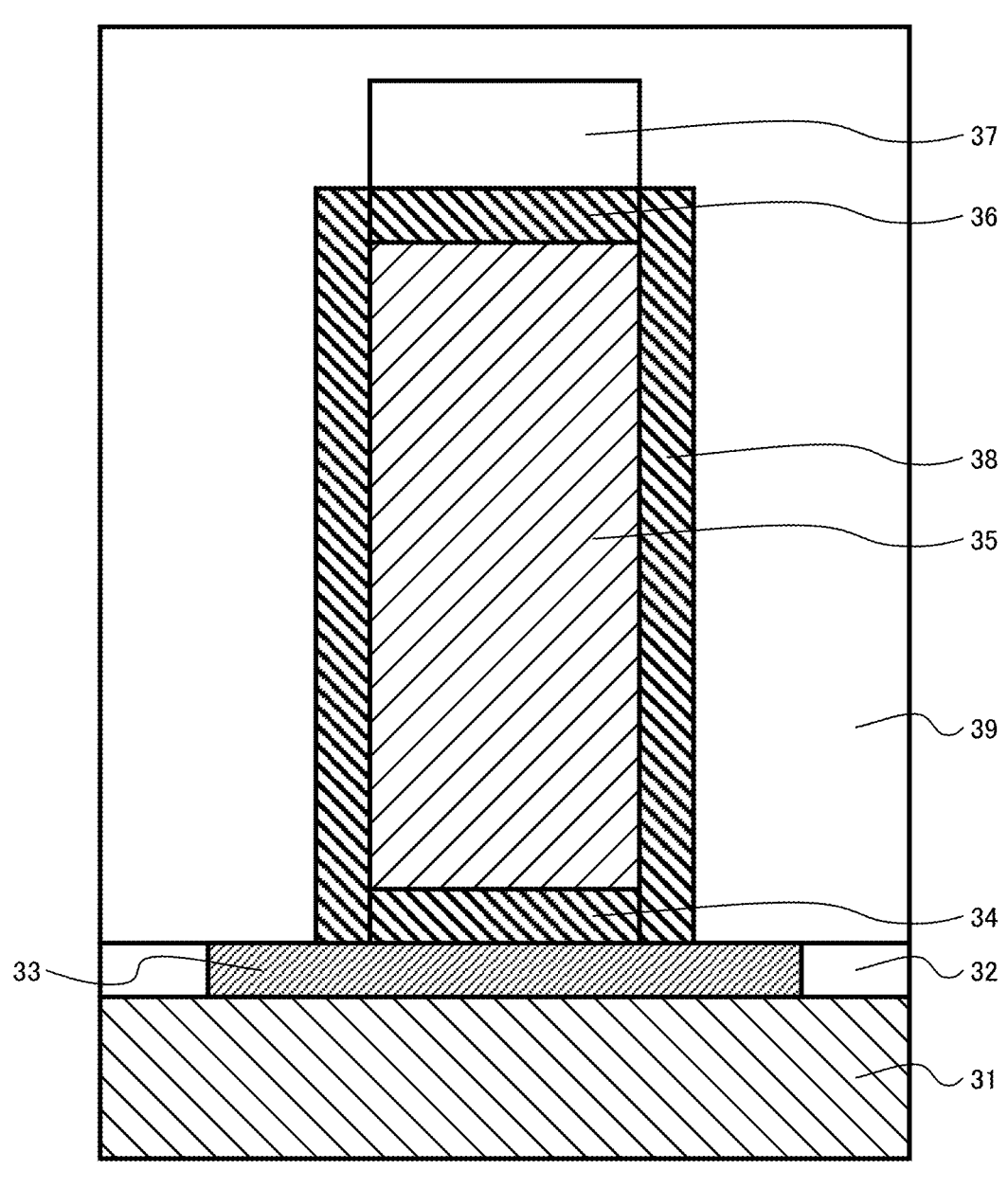
FIG. 8 is a schematic sectional view showing the example of the method of manufacturing the semiconductor device according to the first embodiment.

Next, a third silicon oxide film 39 is formed (FIG. 8). The third silicon oxide film 39 is formed by, for example, a CVD method. A part of the third silicon oxide film 39 finally becomes the first insulating layer 22 and the second insulating layer 24.

Figure 9:
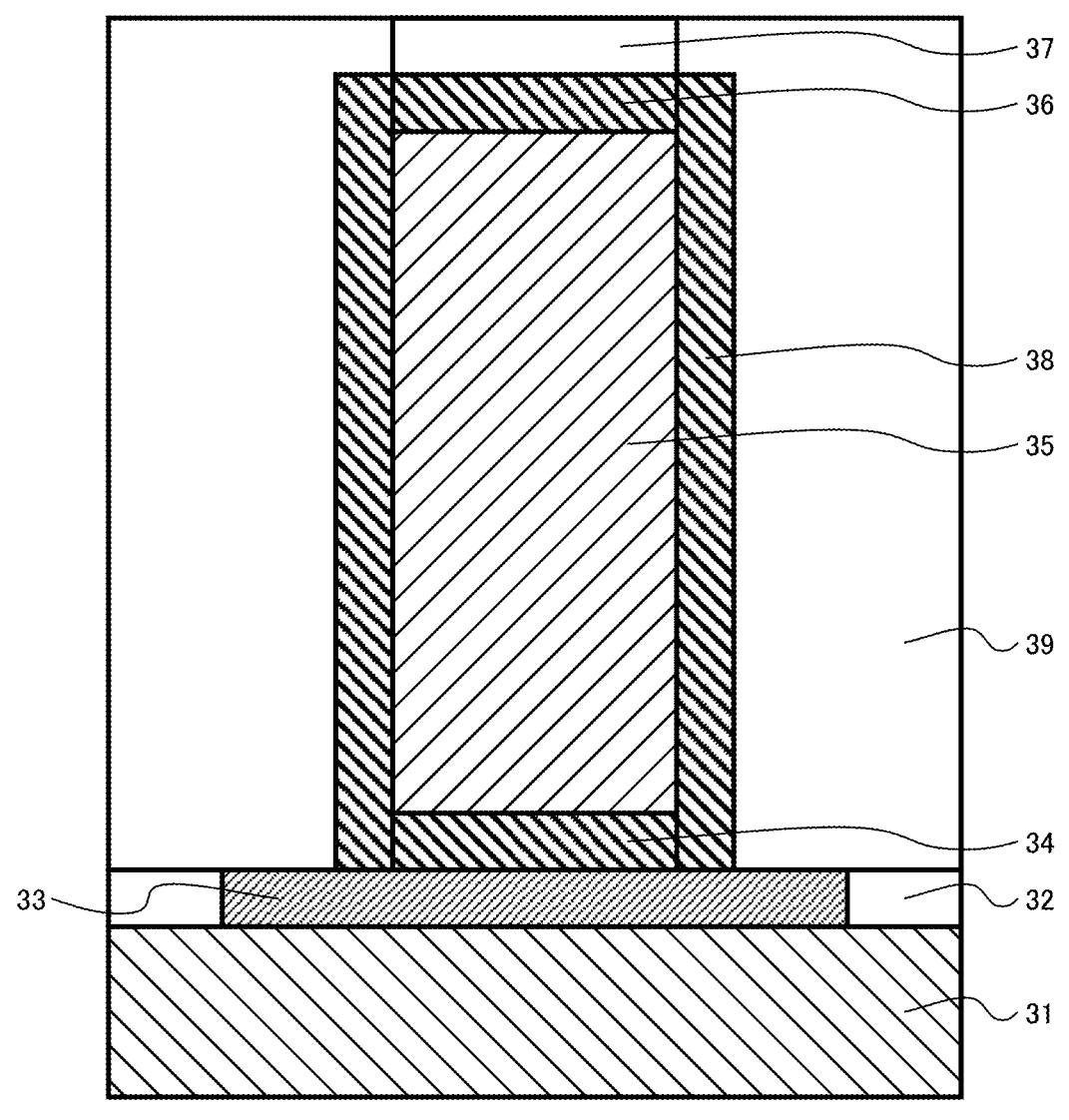
FIG. 9 is a schematic sectional view showing the example of the method of manufacturing the semiconductor device according to the first embodiment.

Next, the surface of the third silicon oxide film 39 is planarized (FIG. 9). The surface of the third silicon oxide film 39 is planarized by, for example, a CMP method.

Figure 10:
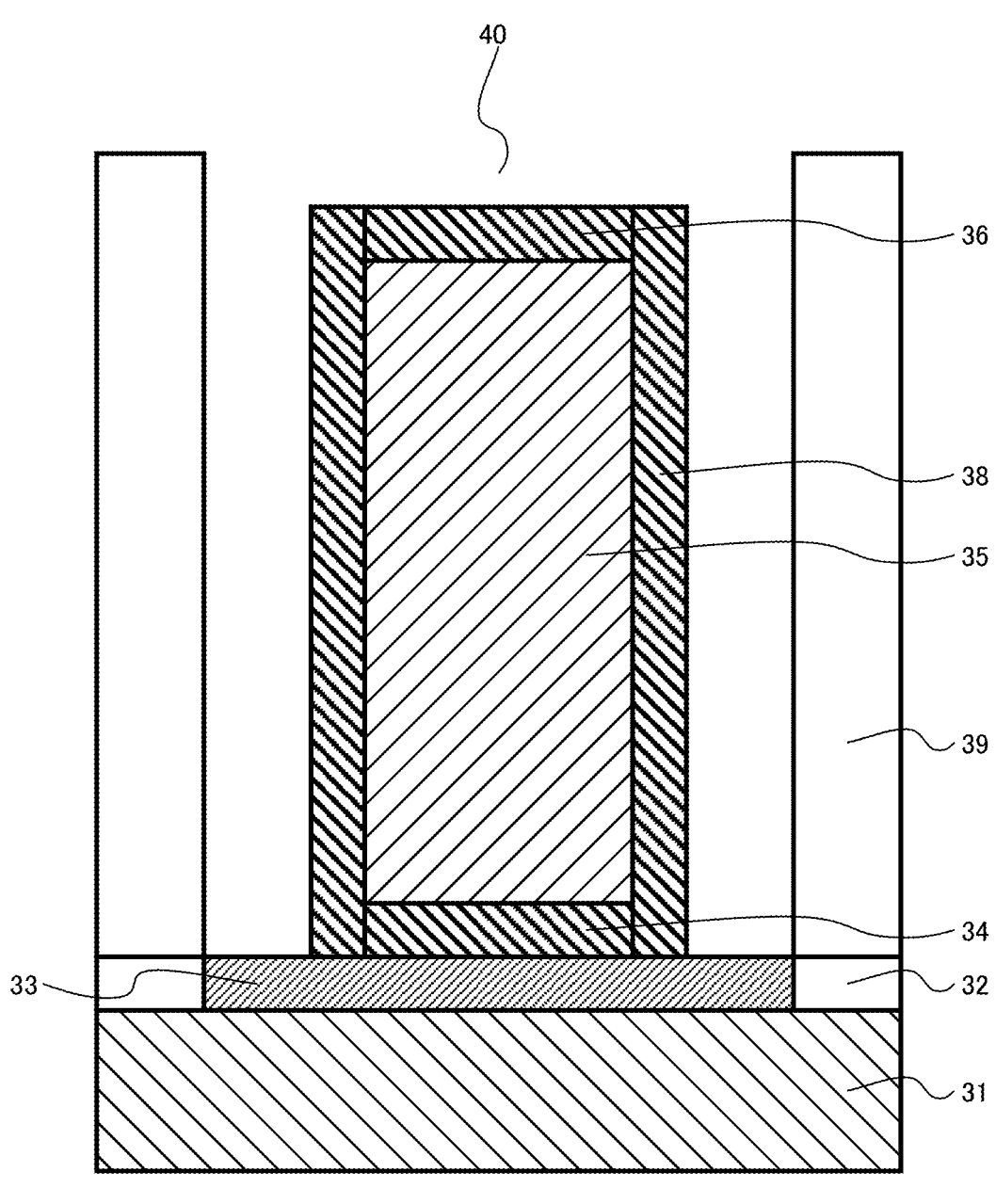
FIG. 10 is a schematic sectional view showing the example of the method of manufacturing the semiconductor device according to the first embodiment.

Next, an opening 40 is formed in the third silicon oxide film 39 (FIG. 10). The opening 40 is formed using, for example, a lithography method and an RIE method.

Figure 11:
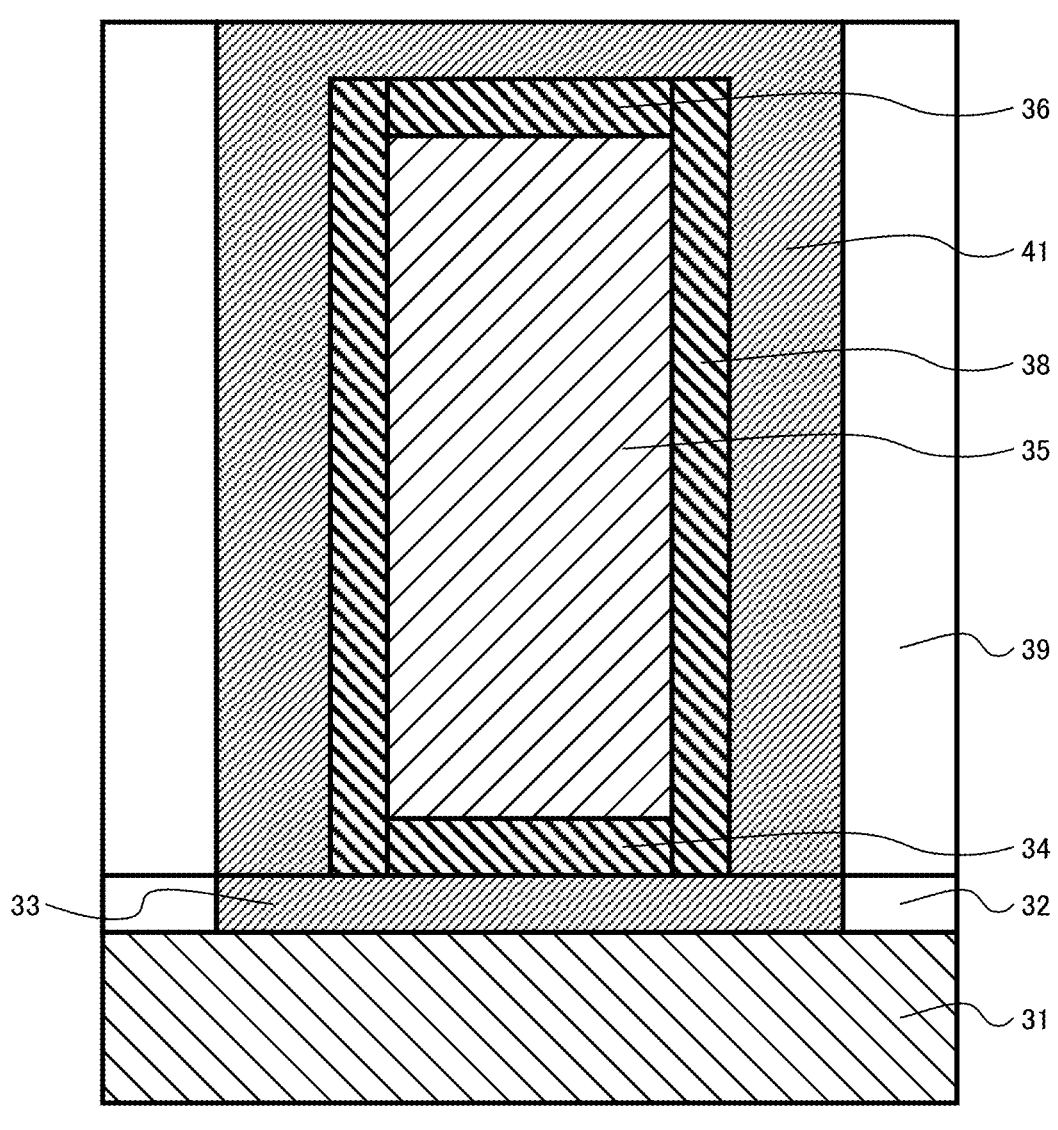
FIG. 11 is a schematic sectional view showing the example of the method of manufacturing the semiconductor device according to the first embodiment.

Next, a second indium gallium zinc oxide film 41 is embedded in the opening 40 (FIG. 11). The second indium gallium zinc oxide film 41 is embedded in the opening 40 by formation of a film by a CVD method and planarization by a CMP method.

Figure 12:
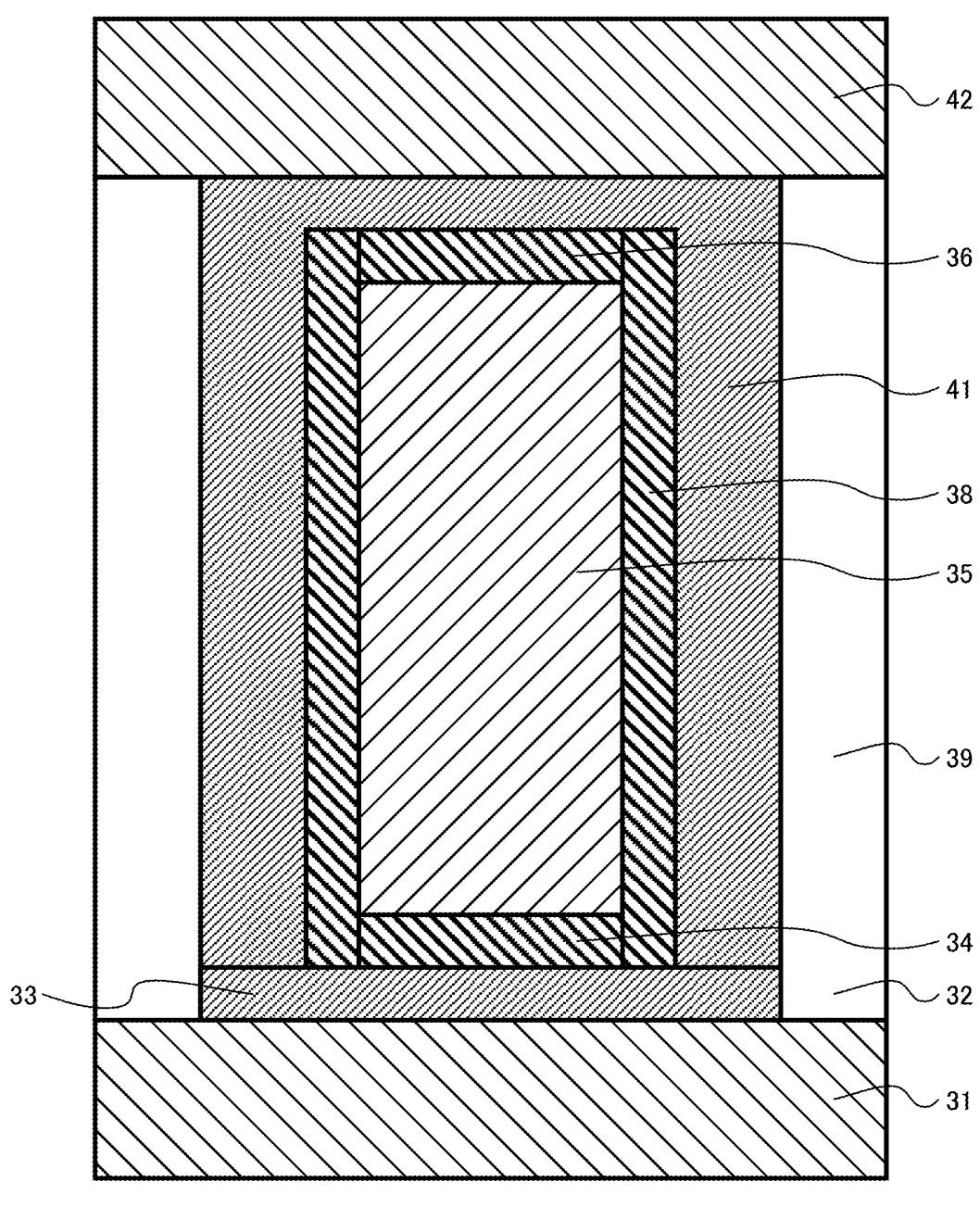
FIG. 12 is a schematic sectional view showing the example of the method of manufacturing the semiconductor device according to the first embodiment.

Next, a second indium tin oxide film 42 is formed on the second indium gallium zinc oxide film 41 (FIG. 12). The second indium tin oxide film 42 is formed by, for example, a CVD method.

The transistor 100 shown in FIGS. 1 and 2 is manufactured by the above manufacturing method.

Next, functions and effects of the semiconductor device according to the first embodiment will be described.

FIG. 13 is a schematic sectional view of a semiconductor device of a comparative example. FIG. 13 is a view corresponding to FIG. 1 of the first embodiment.

The semiconductor device of the comparative example is a transistor 900. The transistor 900 of the comparative example is different from the transistor 100 of the first embodiment in that an oxide semiconductor layer 16 does not include a first region 16*a* and a second region 16*b*. The transistor 900 of the comparative example is different from the transistor 100 of the first embodiment in that a gate insulating layer 20 is in contact with a lower electrode 12 and an upper electrode 14.

In the transistor 900 of the comparative example, at the time of ON operation, a third region 16*c* and a fourth region 16*d* of the oxide semiconductor layer 16 serve as channels, and an on-current flows between the lower electrode 12 and the upper electrode 14. Interface resistances of an interface A1 and an interface A2 between the lower electrode 12 and the oxide semiconductor layer 16 become parasitic resistances of the transistor 900. Similarly, interface resistances of an interface B1 and an interface B2 between the upper electrode 14 and the oxide semiconductor layer 16 become parasitic resistances of the transistor 900.

Figure 14:
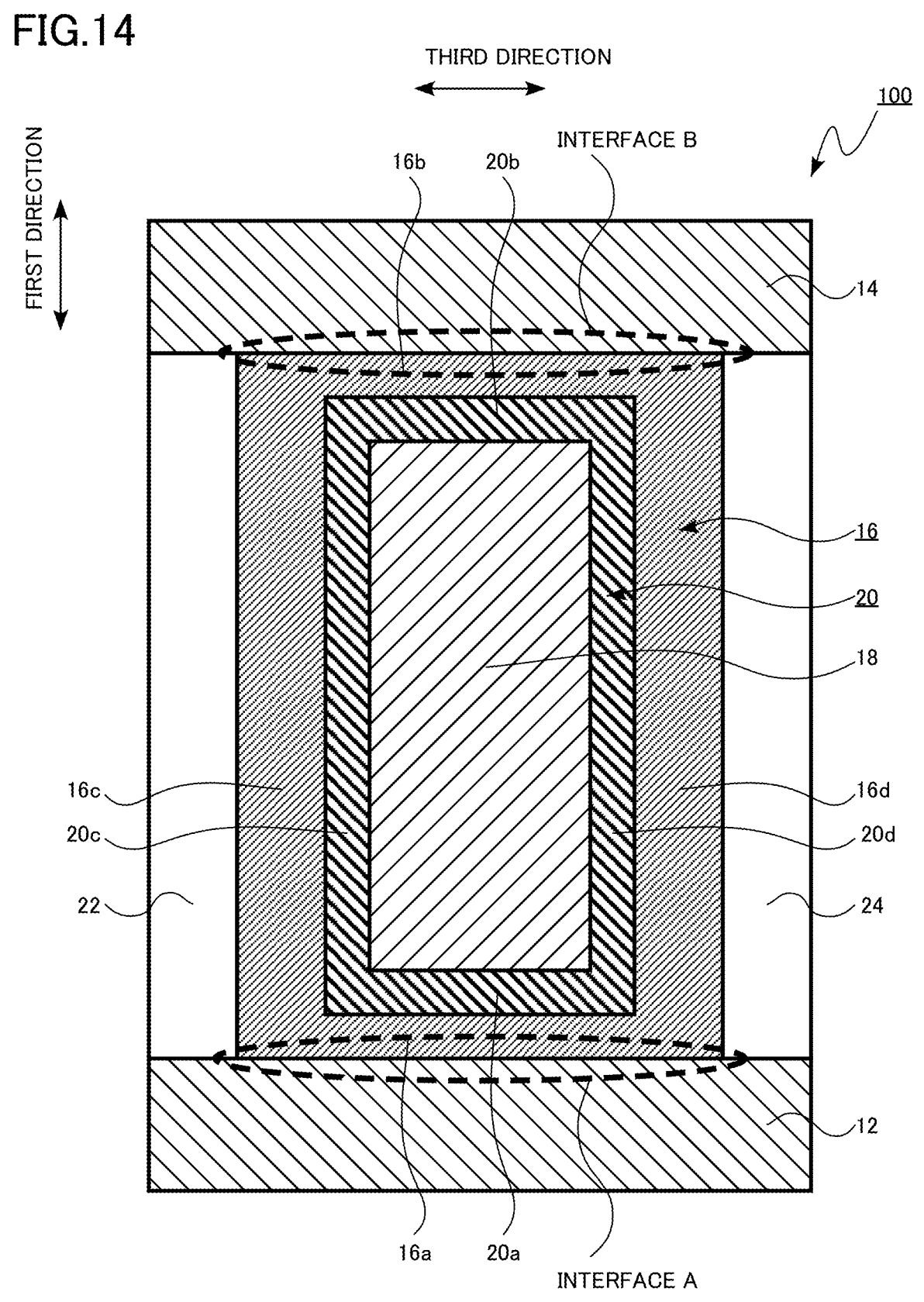

FIG. 14 is an explanatory view of the functions and the effects of the semiconductor device according to the first embodiment. FIG. 14 is a view corresponding to FIG. 1.

In the transistor 100 of the first embodiment, the oxide semiconductor layer 16 includes the first region 16*a* in contact with the lower electrode 12 and the second region 16*b* in contact with the upper electrode 14. In the transistor 100 of the first embodiment, the first region 16*a*, the second region 16b, the third region 16c, and the fourth region 16d of the oxide semiconductor layer 16 serve as channels, and an on-current flows between the lower electrode 12 and the upper electrode 14.

An interface A between the lower electrode 12 and the oxide semiconductor layer 16 is wider than the sum of the interface A1 and the interface A2 of the transistor 900 of the comparative example. Similarly, an interface B between the upper electrode 14 and the oxide semiconductor layer 16 is wider than the sum of the interface B1 and the interface B2 of the transistor 900 of the comparative example.

Therefore, the transistor 100 of the first embodiment has a lower interface resistance as a parasitic resistance than the transistor 900 of the comparative example. Therefore, the on-resistance of the transistor 100 is reduced, and a transistor with an increased on-current can be realized.

In the transistor 100 of the first embodiment, the first thickness (t1 in FIG. 1) of the first region 16a and the second thickness (t2 in FIG. 1) of the second region 16b are equal to or less than at least one of the third thickness (t3 in FIG. 1) of the third region 16c and the fourth thickness (t4 in FIG. 1) of the fourth region 16d. By setting the first thickness t1 and the second thickness t2 to be equal to or less than at least one of the third thickness t3 and the fourth thickness t4, it is possible to cut off the current by depleting the first region 16a and the second region 16b when the transistor 100 is turned off.

In the transistor 100 of the first embodiment, the first thickness t1 of the first region 16a and the second thickness t2 of the second region 16b are preferably smaller than at least one of the third thickness t3 of the third region 16c and the fourth thickness t4 of the fourth region 16d. By thinning the first region 16a and the second region 16b, the cutoff characteristics of the current due to depletion can be improved. In addition, since the thickness of the third region 16c or the fourth region 16d is large, the on-current can be increased. In other words, both the improvement in cutoff characteristics of the transistor and the increase in on-current can be achieved.

From the viewpoint of improving the cutoff characteristics and increasing the on-current, the first thickness t1 of the first region 16a and the second thickness t2 of the second region 16b are preferably 80% or less, more preferably 50% or less of at least one of the third thickness t3 of the third region 16c and the fourth thickness t4 of the fourth region 16d.

From the viewpoint of improving the cutoff characteristics and increasing the on-current, the first thickness t1 of the first region 16a and the second thickness t2 of the second region 16b are preferably smaller than the third thickness t3 of the third region 16c and the fourth thickness t4 of the fourth region 16d.

From the viewpoint of improving the cutoff characteristics and increasing the on-current, the first thickness t1 of the first region 16a and the second thickness t2 of the second region 16b are preferably 80% or less, more preferably 50% or less of the third thickness t3 of the third region 16c and the fourth thickness t4 of the fourth region 16d.

As described above, the transistor 100 of the first embodiment can reduce the on-resistance and increase the on-current as compared with the transistor 900 of the comparative example. In addition, the transistor 100 of the first embodiment can achieve both the improvement in cutoff characteristics and the increase in on-current.

First Modification

A semiconductor device of a first modification of the first embodiment is different from the semiconductor device according to the first embodiment in that a gate insulating layer includes a first film containing silicon (Si) and oxygen (O) and a second film provided between the first film and a gate electrode and containing silicon (Si) and nitrogen (N).

Figure 15:
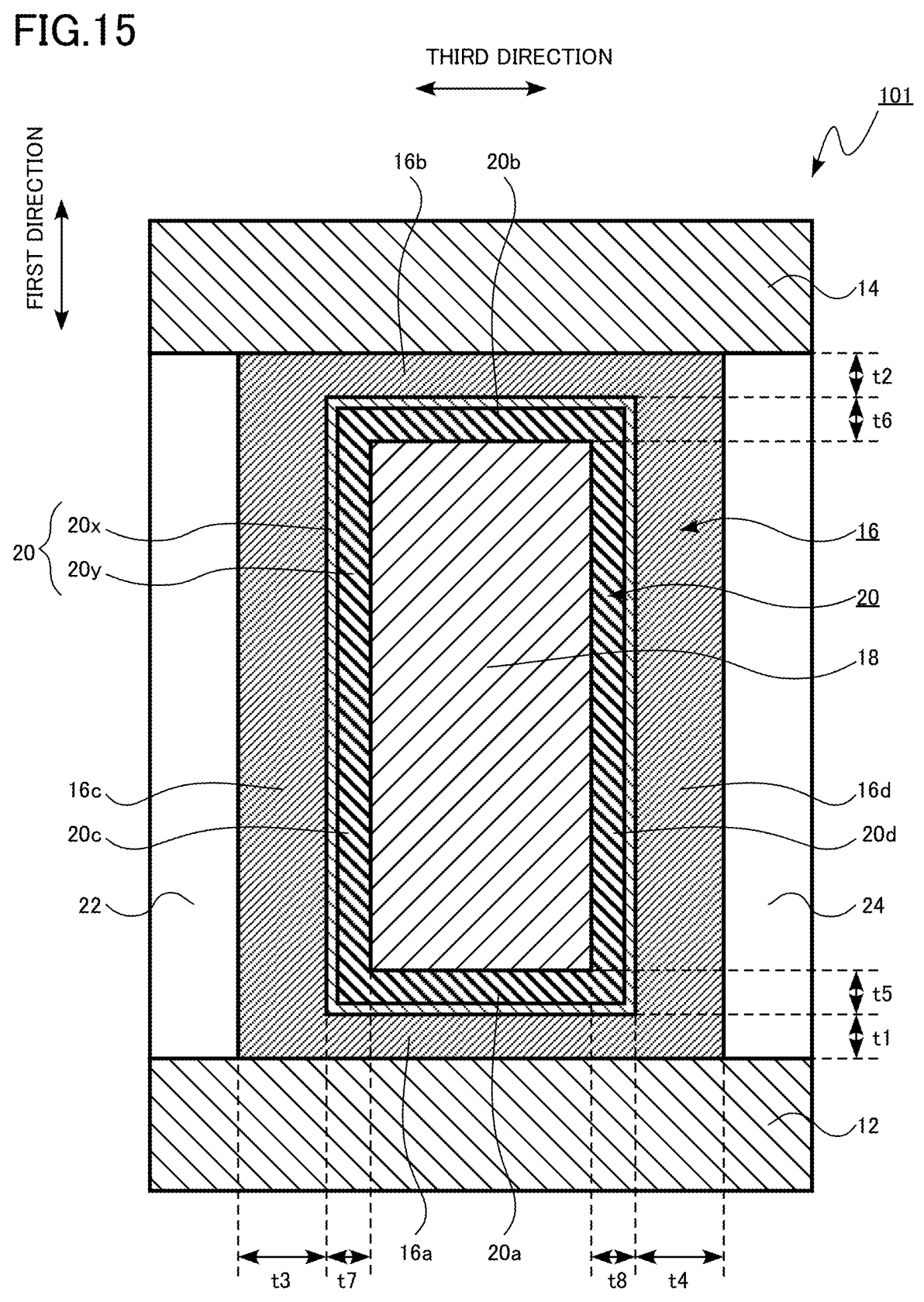

FIG. 15 is a schematic sectional view of a semiconductor device of a first modification of the first embodiment. The semiconductor device of the first modification of the first embodiment is a transistor 101. FIG. 15 is a view corresponding to FIG. 1 of the first embodiment.

A gate insulating layer 20 of the transistor 101 includes a first film 20x and a second film 20y. The gate insulating layer 20 has a stacked structure of the first film 20x and the second film 20y. The second film 20y is provided between the first film 20x and a gate electrode 18.

The first film 20x contains silicon (Si) and oxygen (O). The first film 20x is, for example, a silicon oxide film.

The second film 20y contains silicon (Si) and nitrogen (N). The second film 20y is, for example, a silicon nitride film.

In the transistor 101 of the first modification, the gate insulating layer 20 has a stacked structure of the first film 20x and the second film 20y, so that, for example, the gate leakage current is reduced. In addition, in the transistor 101 of the first modification, the gate insulating layer 20 has a stacked structure of the first film 20x and the second film 20y, so that the reliability of the gate insulating layer 20 is improved, for example.

Second Modification

A semiconductor device of a second modification of the first embodiment is different from the semiconductor device according to the first embodiment in that a fifth thickness of a first portion of a gate insulating layer and a sixth thickness of a second portion of the gate insulating layer are smaller than a seventh thickness of a third portion of the gate insulating layer and an eighth thickness of a fourth portion of the gate insulating layer.

Figure 16:
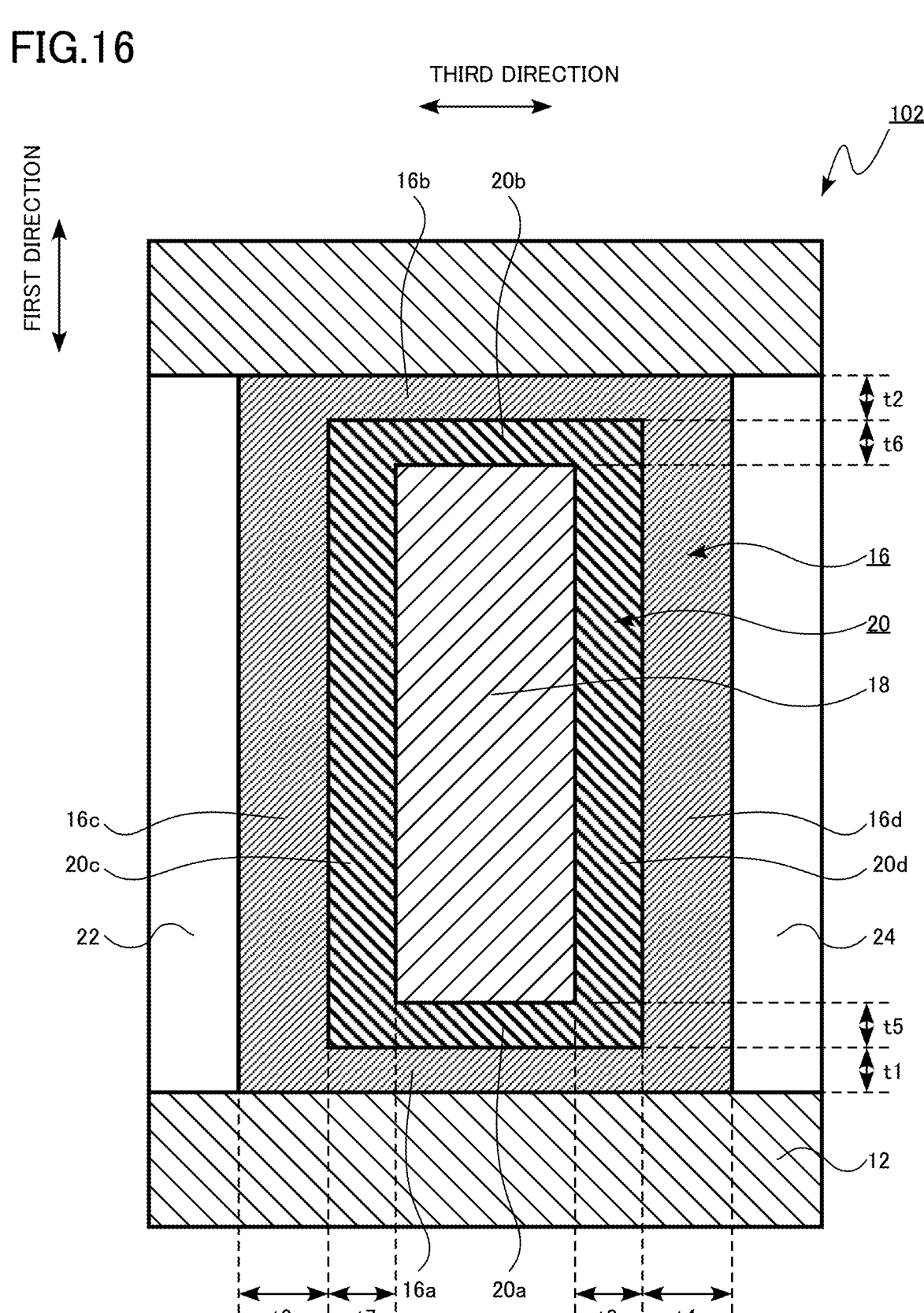
FIG. 16 is a schematic sectional view of a semiconductor device of a second modification of the first embodiment.

FIG. 16 is a schematic sectional view of the semiconductor device of the second modification of the first embodiment. The semiconductor device of the second modification of the first embodiment is a transistor 102. FIG. 16 is a view corresponding to FIG. 1 of the first embodiment.

A fifth thickness (t5 in FIG. 16) of a first portion 20a of a gate insulating layer 20 of the transistor 102 and a sixth thickness (t6 in FIG. 16) of a second portion 20b of the gate insulating layer 20 are smaller than a seventh thickness (t7 in FIG. 16) of a third portion of the gate insulating layer 20 and an eighth thickness (t8 in FIG. 16) of a fourth portion 20d of the gate insulating layer 20. In other words, the seventh thickness t7 and the eighth thickness t8 are larger than the fifth thickness t5 and the sixth thickness t6.

By making the seventh thickness t7 and the eighth thickness t8 larger than the fifth thickness t5 and the sixth thickness t6, the gate leakage current in the third portion 20c of the gate insulating layer 20 and the fourth portion 20d of the gate insulating layer 20 can be reduced. In addition, by making the fifth thickness t5 and the sixth thickness t6 smaller than the seventh thickness t7 and the eighth thickness t8, the cutoff characteristics in the first region 16a of the oxide semiconductor layer 16 and the second region 16b of the oxide semiconductor layer 16 can be improved.

According to the transistor 102 of the second modification, it is possible to reduce the gate leakage current of the gate insulating layer 20 and improve the cutoff characteristics.

As described above, according to the first embodiment and the modifications, the on-resistance is reduced, and a semiconductor device having excellent transistor characteristics can be realized.

Second Embodiment

A semiconductor memory device according to a second embodiment includes the semiconductor device according to the first embodiment and a capacitor electrically connected to a first electrode or a second electrode.

The semiconductor memory device according to the second embodiment is a semiconductor memory 200. The semiconductor memory device according to the second embodiment is a DRAM. The semiconductor memory 200 uses the transistor 100 of the first embodiment as a switching transistor of a memory cell of the DRAM.

Hereinafter, a part of the description overlapping with that of the first embodiment will be omitted.

Figure 17:
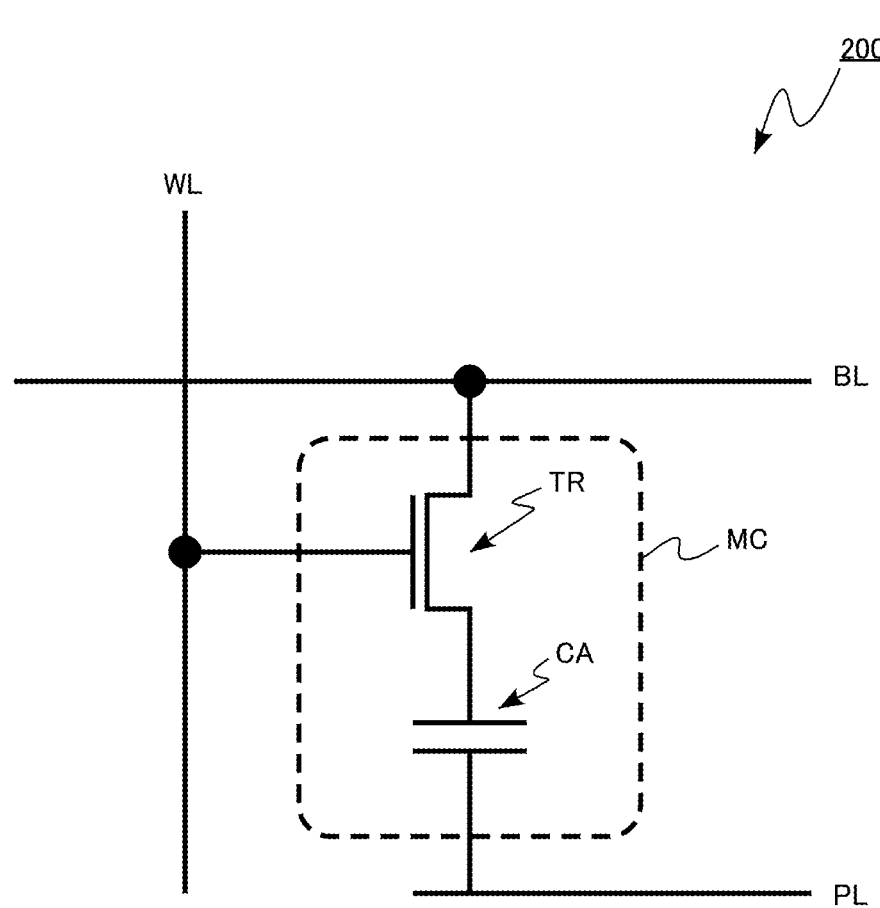
FIG. 17 is an equivalent circuit view of a semiconductor memory device according to a second embodiment.

FIG. 17 is an equivalent circuit view of the semiconductor memory device according to the second embodiment. FIG. 17 shows a case where one memory cell MC is provided, but a plurality of memory cells MC may be provided in an array, for example.

The semiconductor memory 200 includes a memory cell MC, a word line WL, a bit line BL, and a plate line PL. The memory cell MC includes a switching transistor TR and a capacitor CA. In FIG. 17, a region surrounded by a broken line is the memory cell MC.

The word line WL is electrically connected to a gate electrode of the switching transistor TR. The bit line BL is electrically connected to one of source and drain electrodes of the switching transistor TR. One electrode of the capacitor CA is electrically connected to the other of the source and drain electrodes of the switching transistor TR. The other electrode of the capacitor CA is connected to the plate line PL.

The memory cell MC stores data by accumulating charges in the capacitor CA. Data is written and read by turning on the switching transistor TR.

For example, the switching transistor TR is turned on in a state where a desired voltage is applied to the bit line BL, and data is written to the memory cell MC.

In addition, for example, the switching transistor TR is turned on, a voltage change of the bit line BL corresponding to the charge amount accumulated in the capacitor is detected, and data of the memory cell MC is read.

Figure 18:
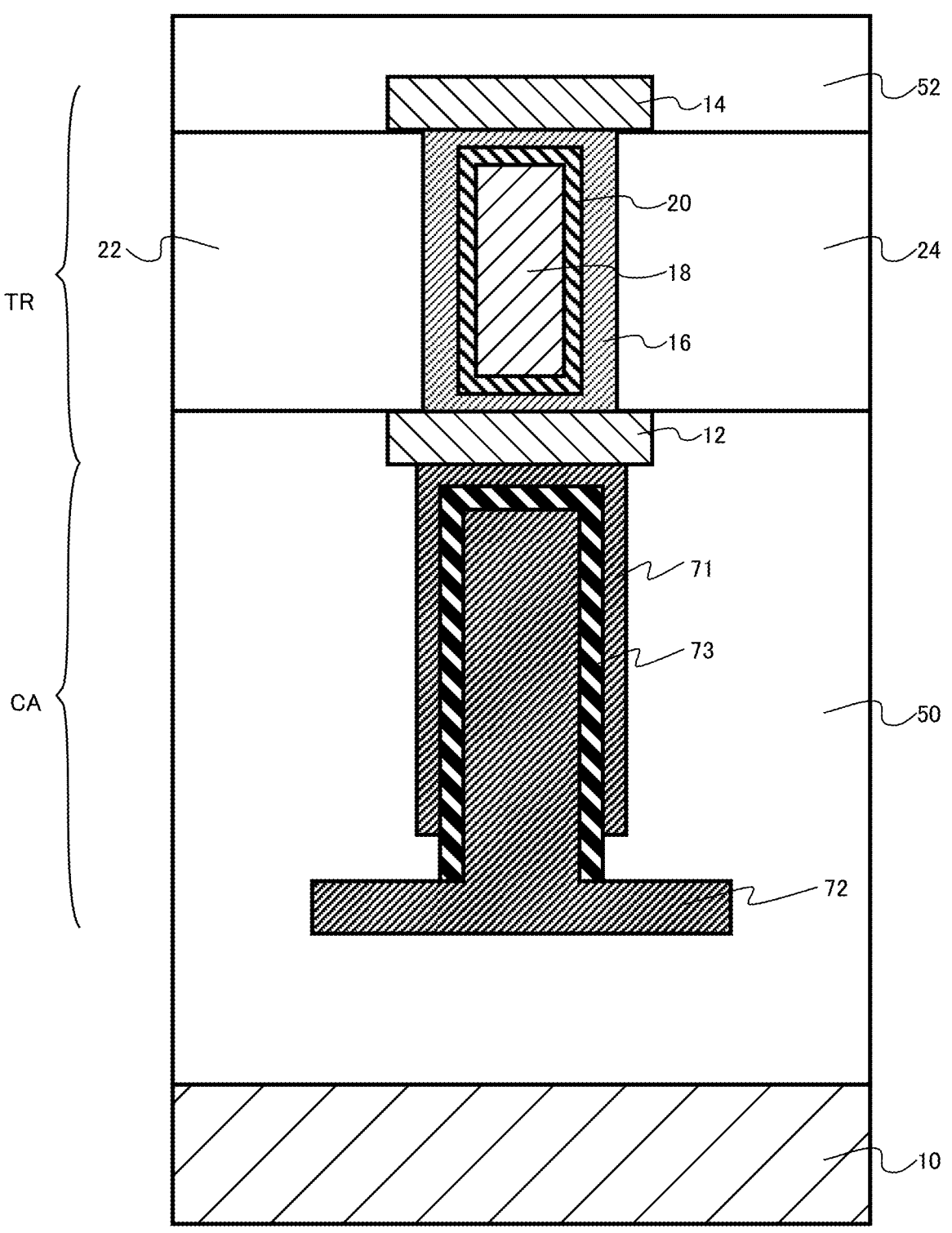
FIG. 18 is a schematic sectional view of the semiconductor memory device according to the second embodiment.

FIG. 18 is a schematic sectional view of the semiconductor memory device according to the second embodiment. FIG. 18 shows a cross section of the memory cell MC of the semiconductor memory 200.

The semiconductor memory 200 includes a silicon substrate 10, a switching transistor TR, a capacitor CA, a first interlayer insulating layer 50, and a second interlayer insulating layer 52.

The switching transistor TR includes a lower electrode 12, an upper electrode 14, an oxide semiconductor layer 16, a gate electrode 18, a gate insulating layer 20, a first insulating layer 22, and a second insulating layer 24.

The switching transistor TR has the same structure as the transistor 100 of the first embodiment.

The capacitor CA is provided between the silicon substrate 10 and the switching transistor TR. The capacitor CA is provided between the silicon substrate 10 and the lower electrode 12. The capacitor CA is electrically connected to the lower electrode 12.

The capacitor CA includes a cell electrode 71, a plate electrode 72, and a capacitor insulating film 73. The cell electrode 71 is electrically connected to the lower electrode 12. The cell electrode 71 is in contact with the lower electrode 12, for example.

The cell electrode 71 and the plate electrode 72 are, for example, titanium nitride. The capacitor insulating film 73 has, for example, a stacked structure of zirconium oxide, aluminum oxide, and zirconium oxide.

The gate electrode 18 is electrically connected to, for example, a word line WL (not shown). The upper electrode 14 is electrically connected to, for example, a bit line BL (not shown). The plate electrode 72 is connected to, for example, a plate line PL (not shown).

In the semiconductor memory 200, an oxide semiconductor transistor having an extremely small channel leakage current at the time of OFF operation is applied to the switching transistor TR. Therefore, a DRAM having excellent charge retention characteristics is realized.

In addition, the switching transistor TR of the semiconductor memory 200 has a small on-resistance. Therefore, for example, the write speed or the read speed of the memory cell MC is increased. Therefore, the operation characteristics of the semiconductor memory 200 are improved.

In the second embodiment, the semiconductor memory to which the transistor of the first embodiment is applied has been described as an example, but the semiconductor memory according to the embodiment of the present disclosure may be a semiconductor memory to which the transistor of the first modification of the first embodiment or the transistor of the second modification of the first embodiment is applied.

In the second embodiment, the semiconductor memory in which the cell electrode is electrically connected to the lower electrode 12 has been described as an example, but the semiconductor memory according to the embodiment of the present disclosure may be a semiconductor memory in which the cell electrode is electrically connected to the upper electrode 14.

The capacitor CA may have a structure provided on the switching transistor TR. The switching transistor TR may be provided between the silicon substrate 10 and the capacitor CA.

While certain embodiments have been described, these embodiments have been presented by way of example only, and are not intended to limit the scope of the inventions. Indeed, the semiconductor device and the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising: a substrate: a first electrode provided above the substrate; a second electrode provided in a first direction with respect to the first electrode, the first direction being perpendicular to a top surface of the substrate; a gate electrode provided between the first electrode and the second electrode and extending in a second direction intersecting the first direction; a first insulating layer provided in a third direction intersecting the first direction and the second direction with respect to the gate electrode; a second insulating layer provided in the third direction with respect to the gate electrode, the gate electrode being provided between the second insulating layer and the first insulating layer; a gate insulating layer surrounding the gate electrode, the gate insulating layer including a first portion provided between the gate electrode and the first electrode, a second portion provided between the gate electrode and the second electrode, a third portion provided between the gate electrode and the first insulating layer, and a fourth portion provided between the gate electrode and the second insulating layer; and an oxide semiconductor layer surrounding the gate insulating layer, the oxide semiconductor layer including a first region between the first portion and the first electrode, a second region between the second portion and the second electrode; a third region between the third portion and the first insulating layer, and a fourth region between the fourth portion and the second insulating layer, a first thickness of the first region and a second thickness of the second region being equal to or less than at least one of a third thickness of the third region and a fourth thickness of the fourth region.

2. The semiconductor device according to claim 1, wherein the first thickness and the second thickness are smaller than at least one of the third thickness and the fourth thickness.

3. The semiconductor device according to claim 1, wherein the first thickness and the second thickness are smaller than the third thickness and the fourth thickness.

4. The semiconductor device according to claim 1, wherein the first thickness and the second thickness are 80% or less of at least one of the third thickness and the fourth thickness.

5. The semiconductor device according to claim 1, wherein a fifth thickness of the first portion and a sixth thickness of the second portion are different.

6. The semiconductor device according to claim 1, wherein the oxide semiconductor layer contains oxygen (O) and at least one element selected from the group consisting of indium (In), gallium (Ga), silicon (Si), aluminum (Al), tin (Sn), and zinc (Zn).

7. The semiconductor device according to claim 1, wherein the gate insulating layer includes a first film containing silicon (Si) and oxygen (O), and a second film provided between the first film and the gate electrode and containing silicon (Si) and nitrogen (N).

8. A semiconductor memory device comprising:

the semiconductor device according to claim 1; and a capacitor electrically connected to the first electrode or the second electrode.

9. The semiconductor device according to claim 1, wherein a fifth thickness of the first portion and a sixth thickness of the second portion are smaller than a seventh thickness of the third portion and an eighth thickness of the fourth portion.

10. The semiconductor device according to claim 9, wherein the fifth thickness and the sixth thickness are 80% or less of the seventh thickness and the eighth thickness.

* * * * *